(12) United States Patent
Roh et al.

(10) Patent No.: US 6,855,581 B2
(45) Date of Patent: Feb. 15, 2005

(54) METHOD FOR FABRICATING A HIGH-VOLTAGE HIGH-POWER INTEGRATED CIRCUIT DEVICE

(75) Inventors: Tae Moon Roh, Daejon-Shi (KR); Dae Woo Lee, Daejon-Shi (KR); Yil Suk Yang, Daejon-Shi (KR); Il Yong Park, Pyongtaek-Si (KR); Sang Gi Kim, Daejon-Shi (KR); Jin Gun Koo, Daejon-Shi (KR); Jong Dae Kim, Daejon-Shi (KR)

(73) Assignee: Electronics and Telecommunications Research Institute, Daejon-shi (KR)

( * ) Notice: Subject to any disclaimer, the term of this patent is extended or adjusted under 35 U.S.C. 154(b) by 18 days.

(21) Appl. No.: 10/153,975

(22) Filed: May 23, 2002

(65) Prior Publication Data

US 2003/0119229 A1 Jun. 26, 2003

(30) Foreign Application Priority Data

Dec. 26, 2001 (KR) .................................... 2001-0085165

(51) Int. Cl.$^7$ .............................................. H01L 21/84
(52) U.S. Cl. ...................... 438/156; 438/221; 438/273; 438/274
(58) Field of Search ...................... 438/156, 218–221, 438/268–74, 294–6, 400, 424–438

(56) References Cited

U.S. PATENT DOCUMENTS

| | | | |
|---|---|---|---|
| 5,416,041 A | | 5/1995 | Schwalke |
| 5,811,315 A | * | 9/1998 | Yindeepol et al. .......... 438/405 |
| 6,130,458 A | | 10/2000 | Takagi et al. |
| 6,461,902 B1 | * | 10/2002 | Xu et al. .................... 438/163 |

OTHER PUBLICATIONS

SOI High Voltage Integrated Circuit Technology for Plasma Display Panel Drivers by M.R. Lee et al. pp. 285–288.
Application of Partially Bonded SOI Structure To An Intelligent power Device Having Vertical DMOSFET by K. Kobayashi et al., pp. 309–312.

* cited by examiner

*Primary Examiner*—David A. Zarneke
*Assistant Examiner*—Lisa Kilday
(74) *Attorney, Agent, or Firm*—Blakely Sokoloff Taylor & Zafman LLP

(57) ABSTRACT

The present invention relates to a method of fabricating a high-voltage high-power integrated circuit device using a substrate of a SOI structure in which an insulating film and a silicon layer are sequentially stacked on a silicon substrate. The method comprising the steps of sequentially forming an oxide film and a photoresist film on the silicon layer and then performing a photolithography process using a trench mask to pattern the photoresist film; patterning the oxide film using the patterned photoresist film as a mask and then removing the photoresist film remained after the patterning; etching the silicon layer using the patterned oxide film as a mask until the insulating film is exposed to form a trench; forming a nitride film on the entire surface including the trench, performing an annealing process and depositing polysilicon on the entire surface so that the trench is buried; and sequentially removing the polysilicon and the nitride film until the silicon layer is exposed to flatten the surface, thus forming a device isolating film for electrical isolation between devices within the trench. Therefore, the present invention can effectively reduce the isolation area of the trench between the high-voltage high-power device and the logic CMOS device and can easily control the concentration of a deep well.

11 Claims, 6 Drawing Sheets

METHOD FOR FABRICATING A HIGH-VOLTAGE HIGH-POWER INTEGRATED CIRCUIT DEVICE

BACKGROUND OF THE INVENTION

1. Field of the Invention

The invention relates generally to a method of fabricating a high-voltage high-power integrated circuit device, and more particularly to a method of fabricating a high-voltage high-power integrated circuit device using a trench isolation technology capable of significantly reducing the isolated area for electrically isolating a logic CMOS device as well as the high-voltage high-power device and easily controlling the impurity concentration of a deep well.

2. Description of the Prior Art

Generally, a MOS device in which loss of the driving circuit is low is more used than the bipolar transistor as the power device used in the high-voltage high-power integrated circuit (IC). A DMOS is mainly used as the high power device, which includes LDMOS (lateral DMOS) and VDMOS (vertical DMOS). When the power integrated circuit device is fabricated, there are advantages that the process can be simplified and the driving power of the VDMOS transistor become larger, but there is a difficulty in fabricating an integrated circuit (IC) rather than the LDMOS transistor, if a SOI (silicon-on-insulator) substrate is used rather than using a bulk silicon substrate. Therefore, the SOI substrate and the LDMOS transistor are usually used in fabricating the high-voltage high-power integrated circuit (IC).

The high voltage LDMOS transistor and the logic CMOS device are electrically isolated by a device isolation film, which is formed by the trench isolation technology. The trench isolation technology has advantages that it can significantly reduce the isolation area rather than using a p-n junction, significantly reduce the parasitic capacitance and electrically isolate the device even at a high voltage.

The high-voltage high-power integrated circuit (IC) using the SOI substrate consists of a high voltage n-LDMOS transistor and a high voltage p-LDMOS transistor, and a logic CMOS device, as shown in FIG. 1. P type impurities (B, $BF_2$) and n type impurities (P, As) are implanted into regions where a deep p-well (or deep n-well) will be formed, respectively, and an annealing process is performed at high temperature for a long period of time to diffuse the impurities, thus forming the deep p-well 2 (or deep n-well 3). Then, p type impurities (B, $BF_2$) and n type impurities (P, As) are implanted into regions where a p-well and a n-well will be formed, respectively, and an annealing process is performed at high temperature to form the p-well 4 and the n-well 5. After the deep p-well 2 (or deep n-well 3), the p-well 4 and the n-well 5 are formed, the silicon layers 2 and 3 are etched up to the SOI interlayer oxide film 30 to form a trench in order to isolate various components at the silicon substrate 1 and the silicon layers 2 and 3 on the SOI interlayer oxide film 30. Next, silicon within the trench is thermally oxidized to grow the oxide film 33. Thereafter, an oxide film 33 is deposited by means of chemical vapor deposition(CVD) method, and the like and polysilicon 21 into which an impurity is not introduced is deposited by means of chemical vapor deposition method, or the like. Then, polysilicon 21 except for an oxide film 33 which is grown within the trench and the oxide film 33 on the surface is removed by means of etch-back using the photoresist film or chemical mechanical polishing (CMP) method to isolate the device within the trench. In this case, if the deep wells 2 and 3 are formed before the trench is formed, the impurity at an edge of the deep wells 2 and 3 is diffused toward the lateral direction as well as the depth direction during the annealing process at high temperature. Due to this, the concentration of the impurity at the edge of the deep wells 2 and 3 becomes lower than the center of the wells. As a result, it is required that the high voltage device and the logic CMOS device are electrically isolated by two-line trench isolation, by forming a trench within a region where the concentration of the impurity is not lowered at the well edge and also forming a trench outside the wells 2 and 3 in order to completely isolate other high voltage devices.

As such, the conventional technology has disadvantages that it requires the two-line isolation of the trench in order to completely solve a problem depending on the lateral diffusion of the impurity and that the area necessary to isolate the devices is significantly increased.

SUMMARY OF THE INVENTION

The present invention is contrived to solve the above problems and an object of the present invention is to provide a method of fabricating a power integrated circuit device by which a nitride film for the trench into which an impurity is difficult to be diffused is formed between an oxide film for trench and polysilicon for the trench or the nitride film for the trench and polysilicon are buried without forming an oxide film within the trench to form a trench isolation structure.

The present invention can prohibit the lateral diffusion of an impurity generated upon a high-temperature annealing process and thus prevent a phenomenon that the concentration of the impurity around the edge of the well is lowered, by forming the trench before a high-temperature annealing process necessary to form a deep p-well and a deep n-well.

Further, the present invention can prohibit the lateral diffusion in the process of the annealing by arranging and implanting the impurity introduced in order to form a trench and a deep well unlike a conventional method by which two lines of trenches considering the lateral diffusion of the impurity, thus electrically completely isolating the high-voltage high-power devices and the logic CMOS devices using one line of the trench. Therefore, the present invention can reduce the area necessary to isolate the high-voltage high-power device in the high-voltage high-power integrated circuit. Further, the present invention can prevent the lateral diffusion of the impurity to prohibit a phenomenon that the impurity concentration of the well is lowered when the area of the well is small than when the area of the well is large.

In order to accomplish the above object, a method of fabricating a high-voltage high-power integrated circuit device using a substrate of a SOI structure in which an insulating film and a silicon layer are sequentially stacked on a silicon substrate according to the present invention, is characterized in that it comprising the steps of sequentially forming an oxide film and a photoresist film on the silicon layer and then performing a photolithography process using a trench mask to pattern the photoresist film; patterning the oxide film using the patterned photoresist film as a mask and then removing the photoresist film remained after the patterning; etching the silicon layer using the patterned oxide film as a mask until the insulating film is exposed to form a trench; forming a nitride film on the entire surface including the trench, performing an annealing process and depositing polysilicon on the entire surface so that the trench is buried;

and sequentially removing the polysilicon and the nitride film until the silicon layer is exposed to flatten the surface, thus forming a device isolating film for electrical isolation between devices within the trench.

Further, the method further includes a step of forming an oxide film on the entire surface after the trench is formed. The oxide film is formed by oxidizing the sidewall of the trench; and depositing an oxide film on the entire surface.

BRIEF DESCRIPTION OF THE DRAWINGS

The aforementioned aspects and other features of the present invention will be explained in the following description, taken in conjunction with the accompanying drawings, wherein.

DETAILED DESCRIPTION OF PREFERRED EMBODIMENTS

Figure 1:
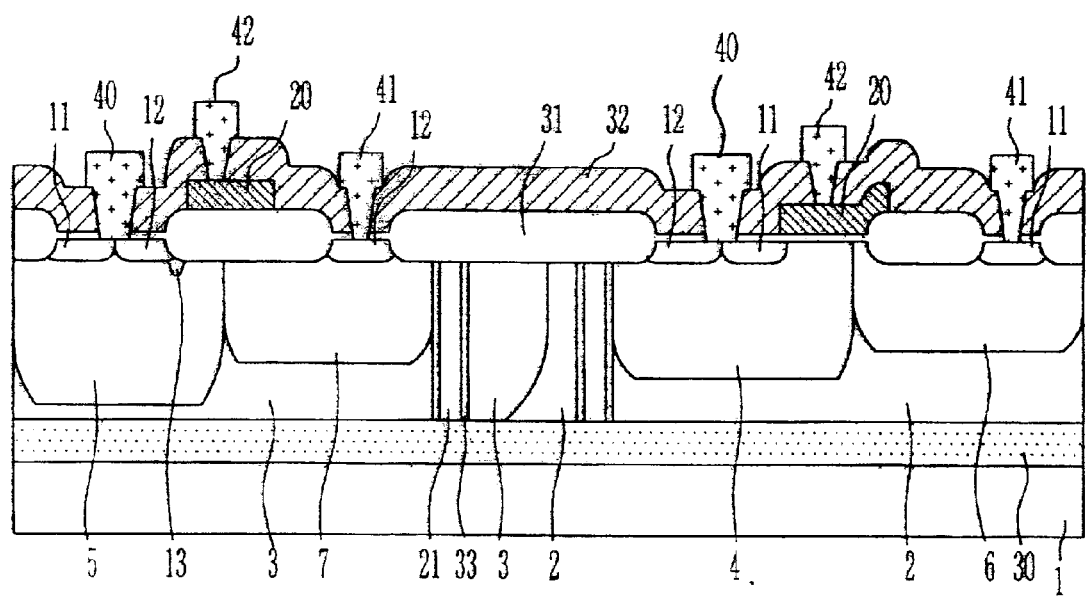
FIG. 1 is a cross-sectional view of a high-voltage high-power integrated circuit device using a conventional trench isolation technology.

The high-voltage high-power integrated circuit device using a SOI substrate includes a high-voltage high-power device such as a p-LDMOS transistor (or p-LIGBT (lateral insulated gate bipolar transistor)) and a n-LDMOS transistor (or n-LIGBT), and the like and a logic CMOS. A method of electrically isolating respective high-voltage high-power device and logic integrated circuit device may include a method of using a p-n junction or a method of using a trench (dielectric isolation technology), or the like.

The isolation technology using the p-n junction has problems that the isolation area is increased and the parasitic capacitance is increased to limit the high voltage isolation. In order to overcome this problem of the p-n junction, the trench isolation technology is employed.

The conventional trench isolation technology forms a deep p-well by means of high-temperature annealing process and ion implantation method for the n-LDMOS transistor or forms the deep n-well for the p-LDMOS transistor. The technology also forms the p-well for the n-LDMOS transistor and the logic n-MOSFET, and the n-well for the p-LDMOS transistor and the logic p-MOSFET, the n-drift and the p-drift. Then, the technology etches the silicon layer where the devices will be formed up to the SOI interlayer oxide film using the etching technology and the trench mask photo work to form a trench. Thereafter, the oxide film is grown and the oxide film is again deposited by means of chemical vapor deposition method, or the like. Next, polysilicon is deposited by means of chemical vapor deposition method, or the like, and polysilicon and the oxide film on the surface except the trench are etched by means of etch-back using the photoresist film or chemical mechanical polishing (CMP) method, thus isolating the trench.

In this method, however, the impurity is diffused toward the lateral direction as well as the vertical direction when the deep n-type (or p-type) well is formed and when annealing is performed at high temperature. Thus, there is a problem that the impurity concentration at the edge of the well is lowered. To overcome this problem, a trench is formed sufficiently inwardly spaced from the edge of the deep well considering this and a trench is formed sufficiently outwardly spaced from the edge of the deep well considering the margin of the process. This conventional trench isolation technology forms two lines of trenches for complete isolation between the devices.

In the present invention, however, a n-type impurity (P, As, etc.) or a p-type impurity (B, $BF_2$, etc.) suitable for the deep well is introduced by means of ion implantation method. A photolithography process using the trench mask is then performed without performing an annealing process at high temperature in order to form a deep well. Next, the silicon layer is etched up to the SOI interlayer insulating film to form a trench. An oxide film is then formed and a nitride film into which the impurity is difficult to be penetrated is deposited by means of chemical vapor deposition method. Thereafter, polysilicon is deposited by means of chemical vapor deposition method, etc. and polysilicon on the surface except for the trench is removed by means of etch-back using the photoresist film or chemical mechanical polishing (CMP) method, so that the trench can be isolated.

According to the present invention, upon an annealing process at high temperature for forming the deep well by diffusing the introduced impurity, a lateral diffusion of the impurity is prevented by the nitride film and a region where the deep well is formed does not extend toward the lateral direction. Therefore, the impurity concentration at the edge of the deep is not reduced. According to the present invention, the impurity does not diffuse toward the lateral direction and the device can thus be sufficiently isolated with only one line of the trench. Therefore, the area occupied by the trench can be significantly reduced and the lateral diffusion of the impurity is prevented, so that reduction in the impurity concentration at the edge of the trench can be prevented. Further, distribution of the impurity concentration of the deep well is not varied depending on the location, and the difference in distribution of the impurity concentration that could be generated depending on the size of the deep well, can be reduced.

The present invention will be described in detail by way of a preferred embodiment with reference to accompanying drawings.

FIG. 2a~FIG. 2i are cross-sectional views of a power integrated circuit device for explaining a method of fabricating the device according to the present invention.

Figure 2A:
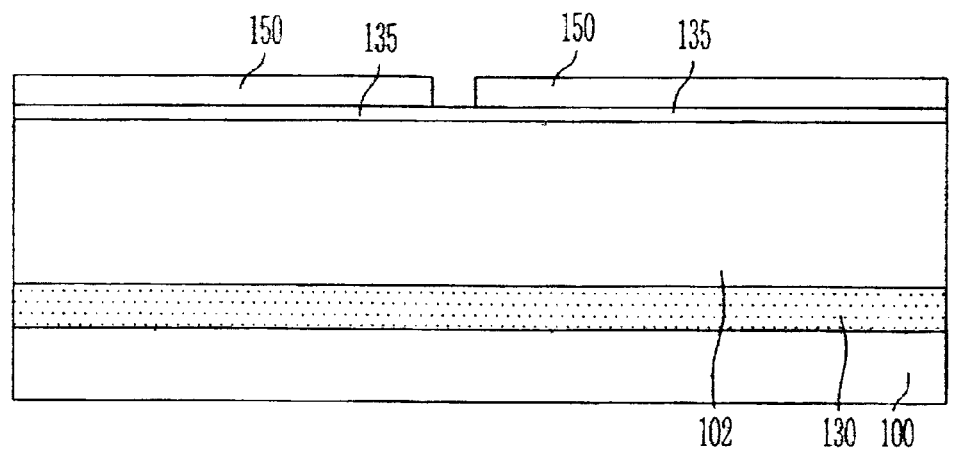
FIG. 2a~FIG. 2i are cross-sectional views of a high-voltage high-power integrated circuit device for explaining a method of fabricating the device according to the present invention.

Referring now to FIG. 2a, a wafer of a SOI structure in which a silicon substrate 100 into which a n type (or p type) impurity is introduced, an insulating film 130 having the thickness of 1~5 mm, and a silicon layer 102 are sequentially stacked is used as a substrate in order to fabricate a power integrated circuit device having a n-LDMOS transistor, a p-LDMOS transistor and a CMOS device. The silicon layer 102 is introduced with a n type (or p type) impurity in a region in which a device is formed, has the resistivity of 0.01~100Ω·cm and has the thickness of 0.5~20 µm.

An oxide film 135 having the thickness of 2000~1000 Å is formed on the silicon layer 102. A photoresist film 150 is then formed on the oxide film 135 and is then patterned by means of a photolithography process using the trench as a mask. At this time, it is preferred that the width between the photoresist film patterns 150, that is, the width of the trench to be formed be 1~3 µm.

Figure 2B:
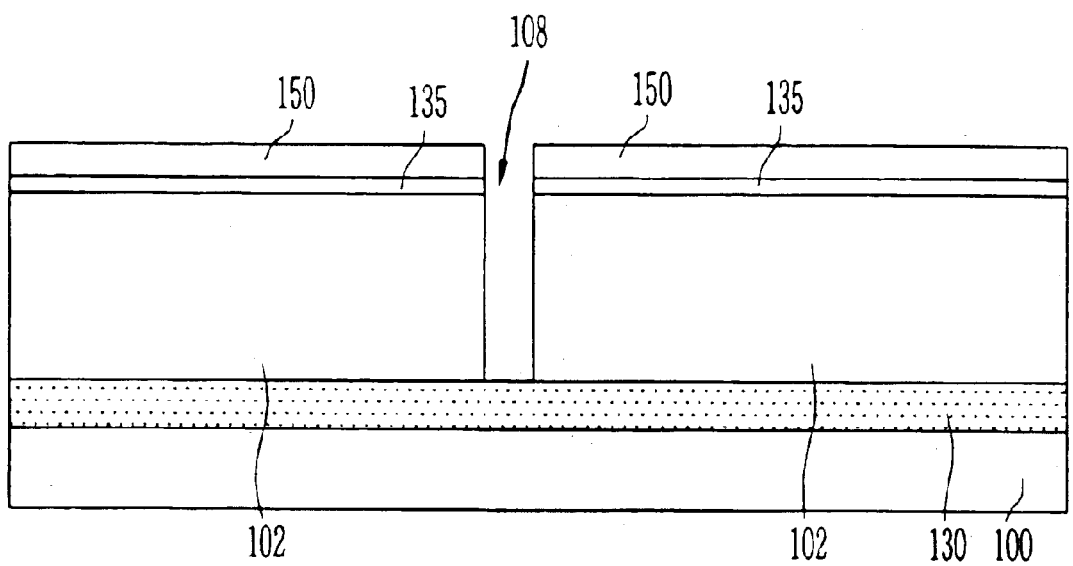

Referring now to FIG. 2b, the oxide film 135 is etched by means of an anisotropy dry etching method using the photoresist film pattern 150 as a mask and the remaining photoresist film patterns 150 are then removed. The silicon layer 102 is etched by means of an anisotropy dry etching method using the oxide film 135 as a mask until the insulating film 130 is exposed, thus forming a trench 108.

Figure 2C:
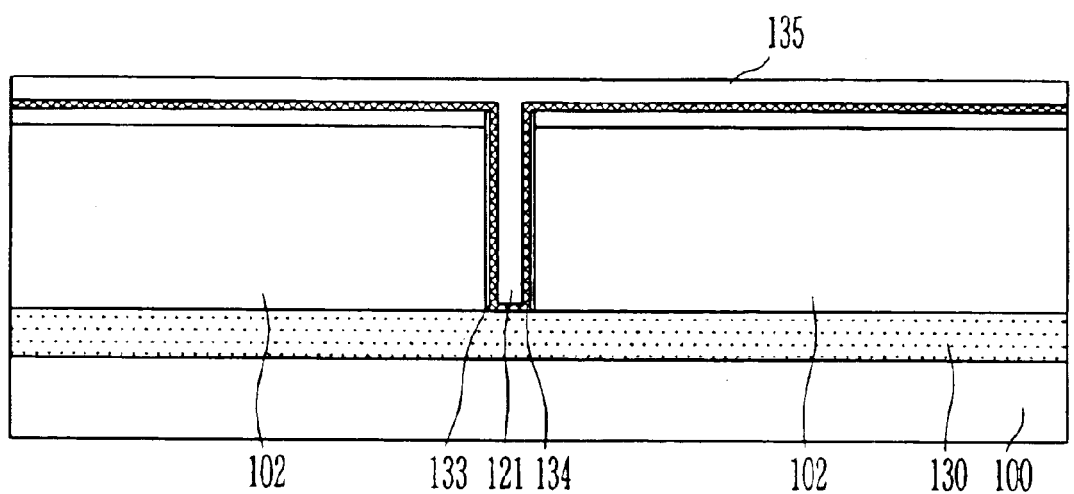

By reference to FIG. 2c, an oxide film 133 and a nitride film 134 are sequentially formed on the entire surface including the trench 108 and are annealed. Next, polysilicon 121 is deposited on the entire surface so that the trench 108 can be buried.

At this time, the oxide film 133 is grown by first oxidizing the sidewall of the trench 108 to form the oxide film having the thickness of 100~1000 Å and then depositing the oxide film in thickness of 1000~10000 Å by means of chemical vapor deposition method, and the like. The nitride film 134 formed in order to prevent diffusion of the impurity is formed in thickness of 1000~10000 Å by means of chemical vapor deposition method, and the like. Also, the polysilicon 121 is deposited in thickness of 1000~10000 Å by means of chemical vapor deposition method, or the like.

Figure 2D:
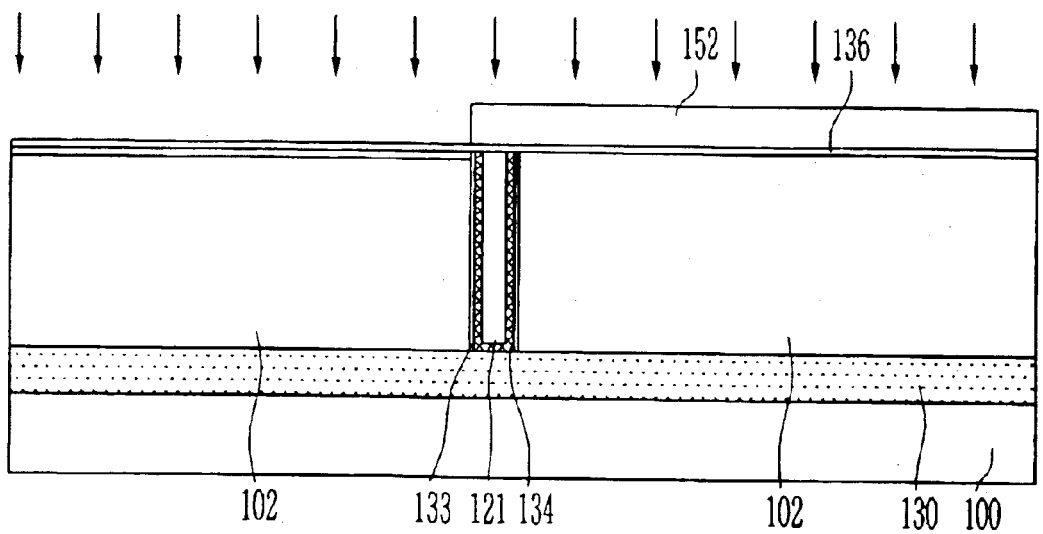

Referring now to FIG. 2d, the polysilicon 121 and the nitride film 134 are sequentially polished by means of chemical mechanical polishing (CMP) method until the silicon layer 102 is exposed so that the surfaces of them can be flattened. Therefore, a device isolation film for completely electrically isolating the LDMOS transistor and the logic CMOS within the trench 108 is formed. Next, the remaining oxide film 135 is removed and a buffer oxide film 136 is grown on the silicon layer 102. After forming a photoresist film 152 on the buffer oxide film 136, the photoresist film 152 is patterned by means of a photolithography process using the deep n-well as a mask. Impurity ions of a n type are implanted into the exposed portion of the silicon layer 102 using the patterned photoresist film 152 as a mask.

Figure 2E:
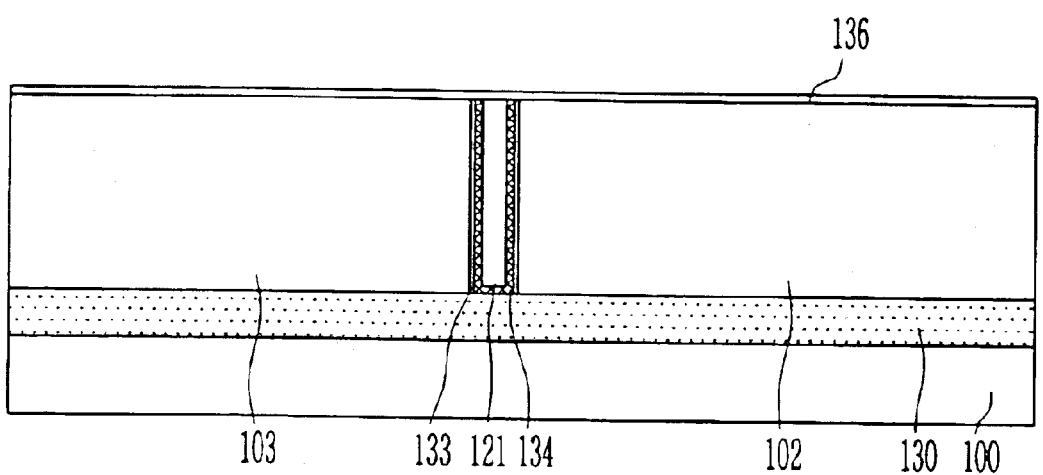

Referring now to FIG. 2e, an annealing process at high temperature for a long period of time is performed so that the silicon layer 102 of a p-type can be completed changed to the silicon layer 103 of a n-type and the photoresist film 152 is then removed.

Figure 2F:
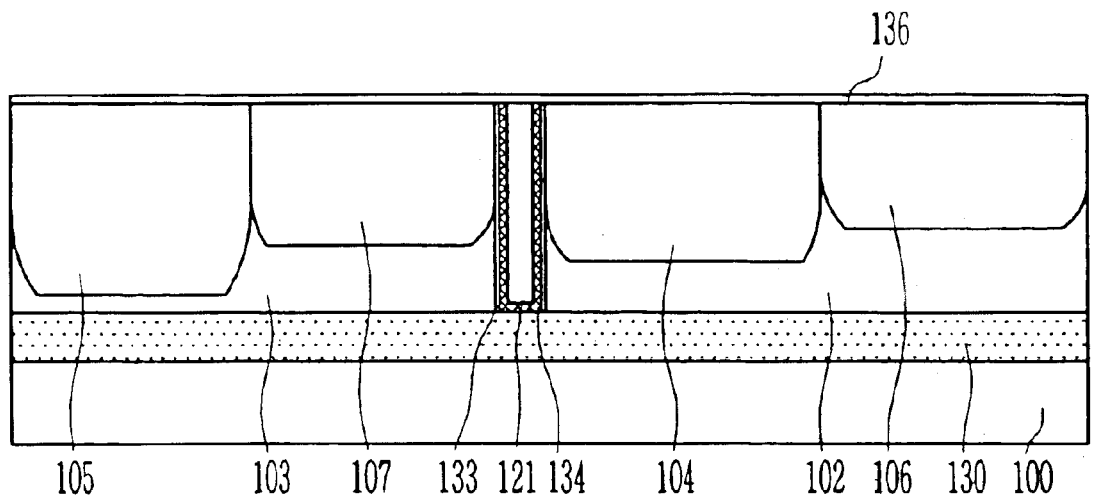

Referring now to FIG. 2f, a region where ions will be implanted is defined using a given mask. Impurities (P, As) of a n-type or impurities (B, $BF_2$) of a p-type are implanted and an annealing process is performed to form a well 104 of the n-LDMOS transistor, a well 105 of the p-LDMOS transistor, the n-drift 106 and the p-drift 107, respectively.

Figure 2G:
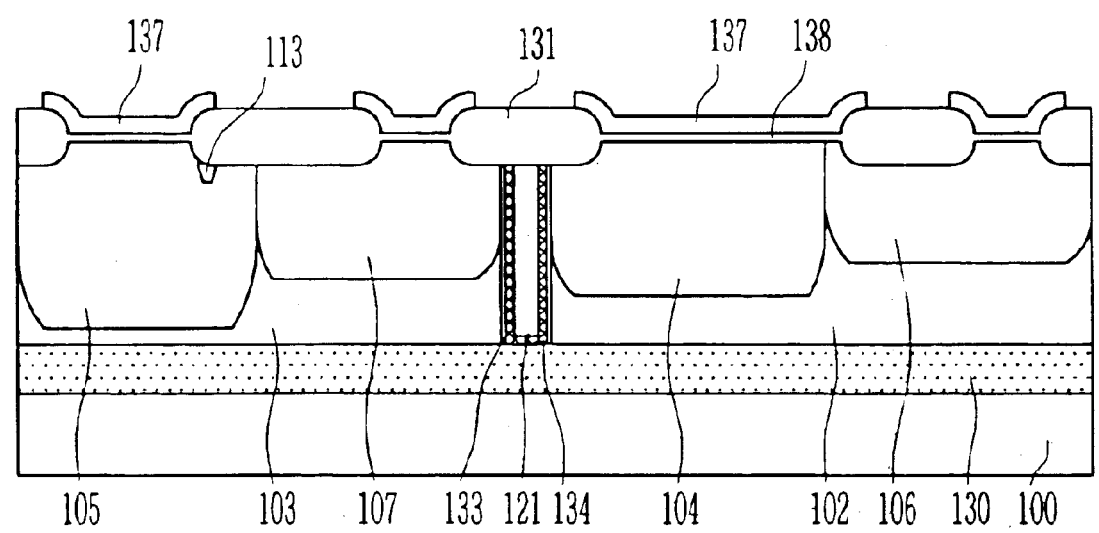

By reference to FIG. 2g, after the buffer oxide film 136 is removed, an oxide film 138 of 100~1000 Å in thickness is grown on the silicon layer 102. P type impurities (B or $BF_2$) ions are then implanted using a given mask to form an assistant $p^+$ junction 113 at a source region of the p-LDMOS transistor. Next, a nitride film 137 of 500~3000 Å in thickness is deposited by means of chemical vapor deposition method. A photolithography process using a mask for defining an active region is performed and the nitride film 137 is then patterned by means of anisotropy dry etching method. In order to control the threshold voltage of the field oxide film at the region where the n-LDMOS transistor and the CMOS device are formed, p type impurities (B or $BF_2$) are implanted with the dose of $1.0 \times 10^{13} \sim 1.0 \times 10^{14}$ cm$^{-2}$. A field oxide film 131 of 3000~10000 Å in thickness is grown by means of LOCOS (local oxidation of silicon) method.

Figure 2H:
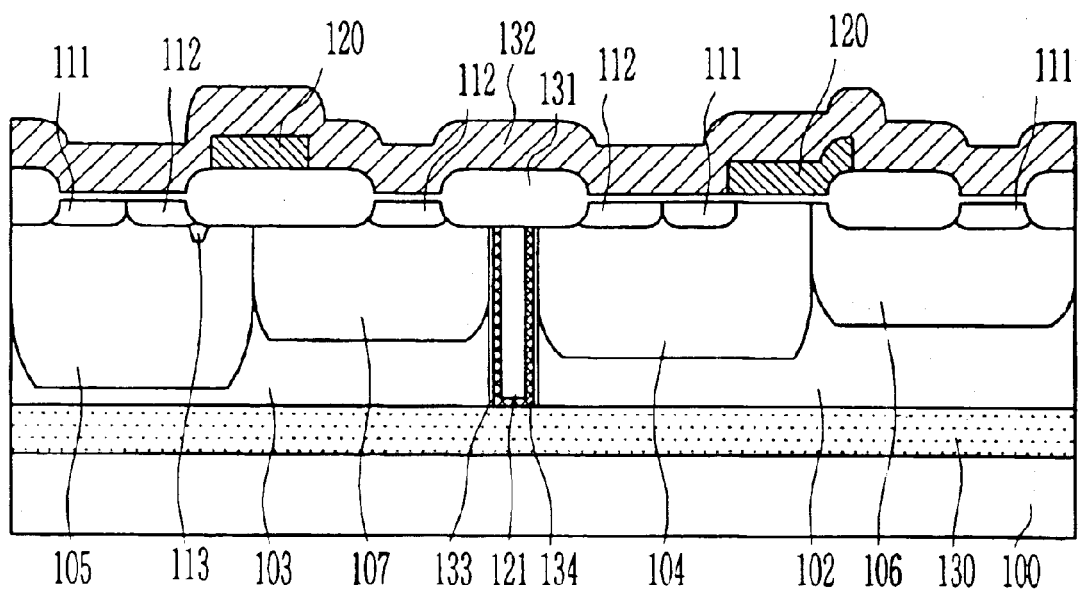

Referring now to FIG. 2h, the nitride film 137 is removed by means of a wet etching method. A sacrifice oxide film (not shown) of 100~1000 Å in thickness is grown on the entire surface. Next, p type impurities (B, $BF_2$) for controlling the threshold voltage are implanted with the dose of $5.0 \times 10^{11} \sim 1.0 \times 10^{13}$ cm$^{-2}$ using a given mask. The sacrifice oxide film is then removed by means of the wet etching method. After a gate oxide film 139 of 100~1000 Å in thickness is grown on the entire surface, a polysilicon film 120 of 2000~6000 Å in thickness is deposited by means of the chemical vapor deposition method. Phosphorous (P), boron (B) and arsenic (As) are introduced into the polysilicon film 120 using $POCl_3$ or ion implantation method. Next, a photolithography process using a mask for the gate electrode is performed and the polysilicon film 120 is then etched by the dry etching method to form a polysilicon gate electrode 120. Then, a photolithography process using an LDD (Lightly Doped Drain) mask is performed and phosphorous (or arsenic) ions are then implanted with the dose of $1.0 \times 10^{12} \sim 1.0 \times 10^{14}$ cm$^{-2}$ to form an LDD region of the n-MOSFET or the n-LDMOS transistor. The ion implantation mask is removed and a photolithography using the LDD mask is then performed. Next, boron (or $BF_2$) ions are implanted with the dose of $1.0 \times 10^{12} \sim 1.0 \times 10^{14}$ cm$^{-2}$ to form an LDD region of the p-MOSFET or the p-LDMOS transistor. After an oxide film is deposited by means of chemical vapor deposition method, an annealing process is performed and a spacer oxide film is then formed by means of anisotropy dry etching method. An insulating film spacer is formed at the sidewall of the gate electrode 120 and a photolithography process using a given mask is then performed. Next, arsenic or phosphorous is implanted with the dose of $1.0 \times 10^{15} \sim 1.0 \times 10^{16}$ cm$^{-2}$ to form an $n^+$ source/drain 111. Then, the ion implantation mask is removed and a photolithography process using a given mask is performed. Thereafter, boron (or $BF_2$) is implanted with the dose of $1.0 \times 10^{15} \sim 1.0 \times 10^{16}$ cm$^{-2}$ to form a $p^+$ source/drain 112. Then, the ion implantation mask is removed and the insulating film 132 of 3000~10000 Å in thickness is deposited on the entire surface by means of the chemical vapor deposition method, which is then annealed.

Figure 2I:
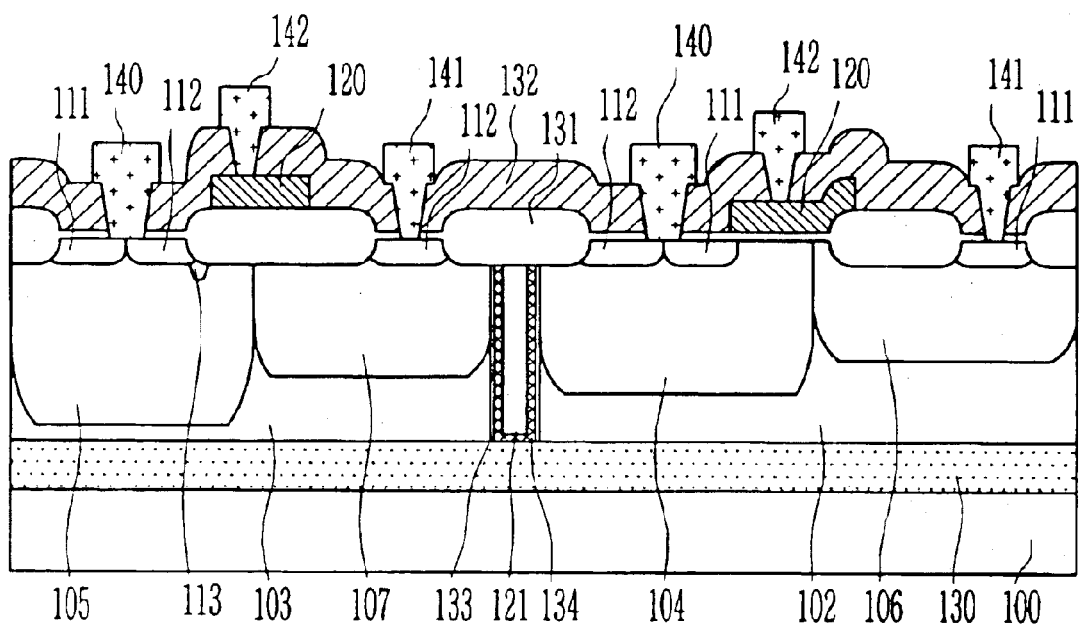

Referring now to FIG. 2i, after a photolithography process using a given mask is then performed, the insulating film 132 is etched by means of the wet etching method (or dry etching method) to form a contact hole. After the contact hole is annealed, a metal is then deposited so that the contact hole can be buried and is patterned to form a metal wiring 140, which is then annealed. In the drawing, a reference numeral 140 indicates a source electrode, 141 a drain electrode, and 142 a gate electrode, respectively.

Figure 3:
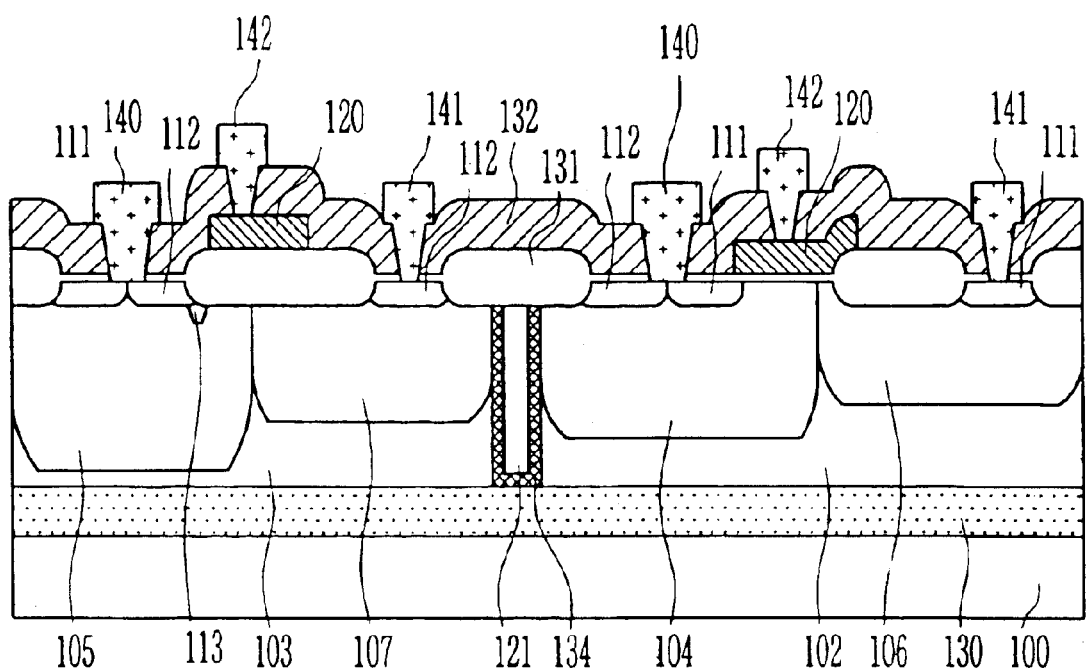
FIG. 3 is a cross-sectional view of a high-voltage high-power integrated circuit device for explaining another embodiment of the present invention.

Meanwhile, the present invention forms a device isolation film in which the nitride film 134 and polysilicon 121 are buried within the trench 108 as shown in FIG. 2c by forming the nitride film 134, without forming the oxide film 133 as shown in FIG. 3. If this method is employed, isolation area of the trench in the high-voltage high-power integrated circuit device can be reduced.

As mentioned above, the present invention includes forming a nitride film between a trench oxide film and a polysilicon film, isolating the trench using the nitride film and polysilicon instead of the trench oxide film and performing a deep well annealing process, in the manufacturing process of a high-voltage high-power integrated circuit device unlike a conventional trench isolation technology. Therefore, the prevent invention has outstanding advantages that it can significantly reduce an area necessary to electrically isolate the high-voltage high-power device and the logic CMOS device and can easily control the concentration of the impurity in the well with no regard to the area of the well since diffusion of the impurity at the edge toward the lateral direction can be prevented.

The present invention has been described with reference to a particular embodiment in connection with a particular application. Those having ordinary skill in the art and access to the teachings of the present invention will recognize additional modifications and applications within the scope thereof.

It is therefore intended by the appended claims to cover any and all such applications, modifications, and embodiments within the scope of the present invention.

What is claimed is:

1. A method of fabricating a high voltage high power integrated circuit device using a substrate of a SOI structure in which an insulating film and a silicon layer are sequentially stacked on a silicon substrate, comprising the steps of:

sequentially forming an oxide film and a photoresist film on said silicon layer and then performing a photolithography process using a trench mask to pattern said photoresist film;

patterning said oxide film using said patterned photoresist film as a mask and then removing the photoresist film remained after the patterning;

etching said silicon layer using the patterned oxide film as a mask until said insulating film is exposed to form a trench;

forming a nitride film on the entire surface including said trench and depositing polysilicon on the entire surface so that said trench is buried;

sequentially removing said polysilicon and said nitride film until said silicon layer is exposed to flatten the surface, thereby forming a device isolating film for electrical isolation between devices; then forming at least one of a deep n-well, a deep p-well, a n-well and a p-well in said silicon layer.

2. The method as claimed in claim 1, wherein said oxide film is formed in thickness of 2000~10000 Å.

3. The method as claimed in claim 1, wherein said trench is formed to have the width of 1~3 μm.

4. The method as claimed in claim 1, wherein said nitride film is deposited by means of a chemical vapor deposition method and is formed to have the thickness of 1000~10000 Å.

5. The method as claimed in claim 1, wherein said polysilicon is deposited by means of a chemical vapor deposition method and is formed to have the thickness of 1000~10000 Å.

6. The method as claimed in claim 1, wherein said polysilicon and said nitride film are removed by either etch-back using the photoresist film or chemical mechanical polishing method.

7. The method as claimed in claim 1, further including a step of forming an oxide film on the entire surface after said trench is formed.

8. The method as claimed in claim 7, wherein said oxide film is formed by oxidizing the sidewall of said trench; and depositing an oxide film on the entire surface.

9. The method as claimed in claim 8, wherein an oxide film having thickness of 100~1000 Å is grown at the sidewall of said trench and said oxide film is deposited in thickness of 1000~5000 Å.

10. The method as claimed in claim 1, wherein the step of forming a deep n-well comprises the steps of:

growing a buffer oxide film on said silicon layer;

forming and patterning a photoresist film on said buffer oxide film;

implanting impurity ions of a n-type into the exposed portion of said silicon layer; and performing an annealing process until the bottom of the exposed portion of said silicon layer is changed to the silicon layer of a n-type.

11. The method as claimed in claim 1, wherein the step of forming a deep p-well comprises the steps of:

growing a buffer oxide film on said silicon layer;

forming and patterning a photoresist film on said buffer oxide film;

implanting impurity ions of a p-type into the exposed portion of said silicon layer; and performing an annealing process until the bottom of the exposed portion of said silicon layer is changed to the silicon layer of a p-type.

* * * * *